United States Patent
Minzoni

(10) Patent No.: US 7,091,764 B2
(45) Date of Patent: Aug. 15, 2006

(54) DUTY DISTORTION DETECTOR

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/981,947

(22) Filed: Nov. 5, 2004

(65) Prior Publication Data

US 2006/0097756 A1  May 11, 2006

(51) Int. Cl.
*H03K 3/017* (2006.01)
*H03L 7/00* (2006.01)

(52) U.S. Cl. .................. 327/175; 327/161; 327/261

(58) Field of Classification Search ........ 327/172–175, 327/161, 271, 261
See application file for complete search history.

(56) References Cited

U.S. PATENT DOCUMENTS

| | | | | |
|---|---|---|---|---|
| 4,475,086 A | | 10/1984 | Allen | |
| 5,572,158 A | * | 11/1996 | Lee et al. | 327/175 |
| 6,060,920 A | * | 5/2000 | Saeki | 327/152 |
| 6,275,547 B1 | * | 8/2001 | Saeki | 375/354 |
| 6,509,775 B1 | * | 1/2003 | Saeki | 327/271 |
| 6,535,040 B1 | * | 3/2003 | Jung et al. | 327/175 |
| 2004/0179421 A1 | * | 9/2004 | Kim et al. | 365/233 |
| 2005/0242857 A1 | * | 11/2005 | Minzoni | 327/172 |

* cited by examiner

*Primary Examiner*—Dinh T. Le
(74) *Attorney, Agent, or Firm*—Dicke,Billig&Czaja PLLC

(57) ABSTRACT

A duty distortion detector comprises a first synchronous mirror delay configured to mirror a first signal with respect to a clock signal to provide a second signal, and a second synchronous mirror delay configured to mirror the second signal with respect to an inverted clock signal to provide the first signal.

25 Claims, 7 Drawing Sheets

DUTY DISTORTION DETECTOR

BACKGROUND

Digital circuits require a clock signal to operate. Typically, a clock signal is provided by a crystal oscillator and associated circuitry, which usually does not provide a clock signal having a duty cycle of 50%. For example, the clock signal may have a duty cycle of 45%, where the logic high phase of the clock signal is 45% of the clock cycle and the logic low phase of the clock signal is the remaining 55% of the clock cycle.

One type of circuit that requires a clock signal to operate is a memory circuit, such as a dynamic random access memory (DRAM), synchronous dynamic random access memory (SDRAM), or double data rate synchronous dynamic random access memory (DDR-SDRAM). For memory circuits operating at high frequencies, a clock signal having a duty cycle as close to 50% as possible is desired so that the memory has approximately an equal amount of time on both the logic high phase and logic low phase of the clock signal for transferring data. A duty cycle of 50% allows the maximum amount of time for latching both rising edge data and falling edge data in a memory circuit. To determine if the duty cycle of a clock signal is greater than 50%, less than 50%, or equal to 50%, a duty distortion detector is used.

SUMMARY

One embodiment of the present invention provides a duty distortion detector. The duty distortion detector comprises a first synchronous mirror delay configured to mirror a first signal with respect to a clock signal to provide a second signal, and a second synchronous mirror delay configured to mirror the second signal with respect to an inverted clock signal to provide the first signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
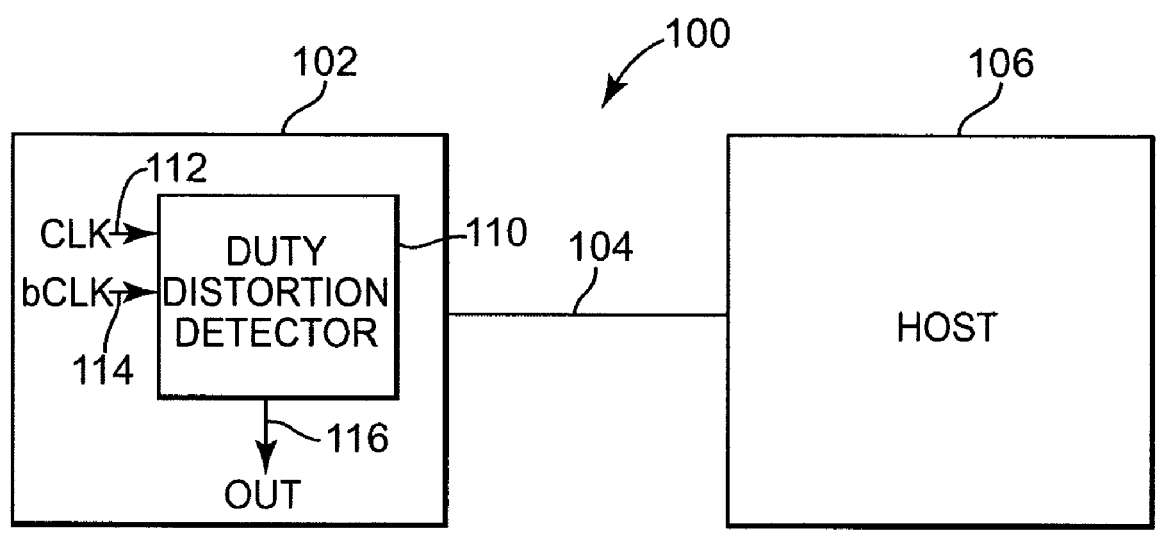
FIG. 1 is a block diagram illustrating one embodiment of a memory system including a duty distortion detector.

FIG. 1 is a block diagram illustrating one embodiment of a memory system 100. Memory system 100 includes a memory circuit 102 and a host 106. Memory circuit 102 includes a duty distortion detector 110. Duty distortion detector 110 receives a differential clock signal, CLK and bCLK, and provides an output signal indicating whether the duty cycle of the differential clock signal is greater than 50%, less than 50%, or approximately equal to 50%. The duty distortion detector comprises a pair of synchronous mirror delays (SMDs) in which the output of the first SMD is mirrored by the second SMD with respect to the bCLK signal, and the output of the second SMD is mirrored by the first SMD with respect to the CLK signal.

Memory circuit 102 is electrically coupled to host 106 through communication link 104. Duty distortion detector 110 receives a clock (CLK) signal on CLK signal path 112 and an inverted clock (bCLK) signal on bCLK signal path 114. Duty distortion detector 110 provides an output (OUT) signal on OUT signal path 116. In one embodiment, the CLK signal and the bCLK signal are passed from host 106 through communication link 104. In one embodiment, memory circuit 102 comprises a random access memory, such as a dynamic random access memory (DRAM), synchronous dynamic random access memory (SDRAM), or double data rate synchronous dynamic random access memory (DDR-SDRAM).

Figure 2:
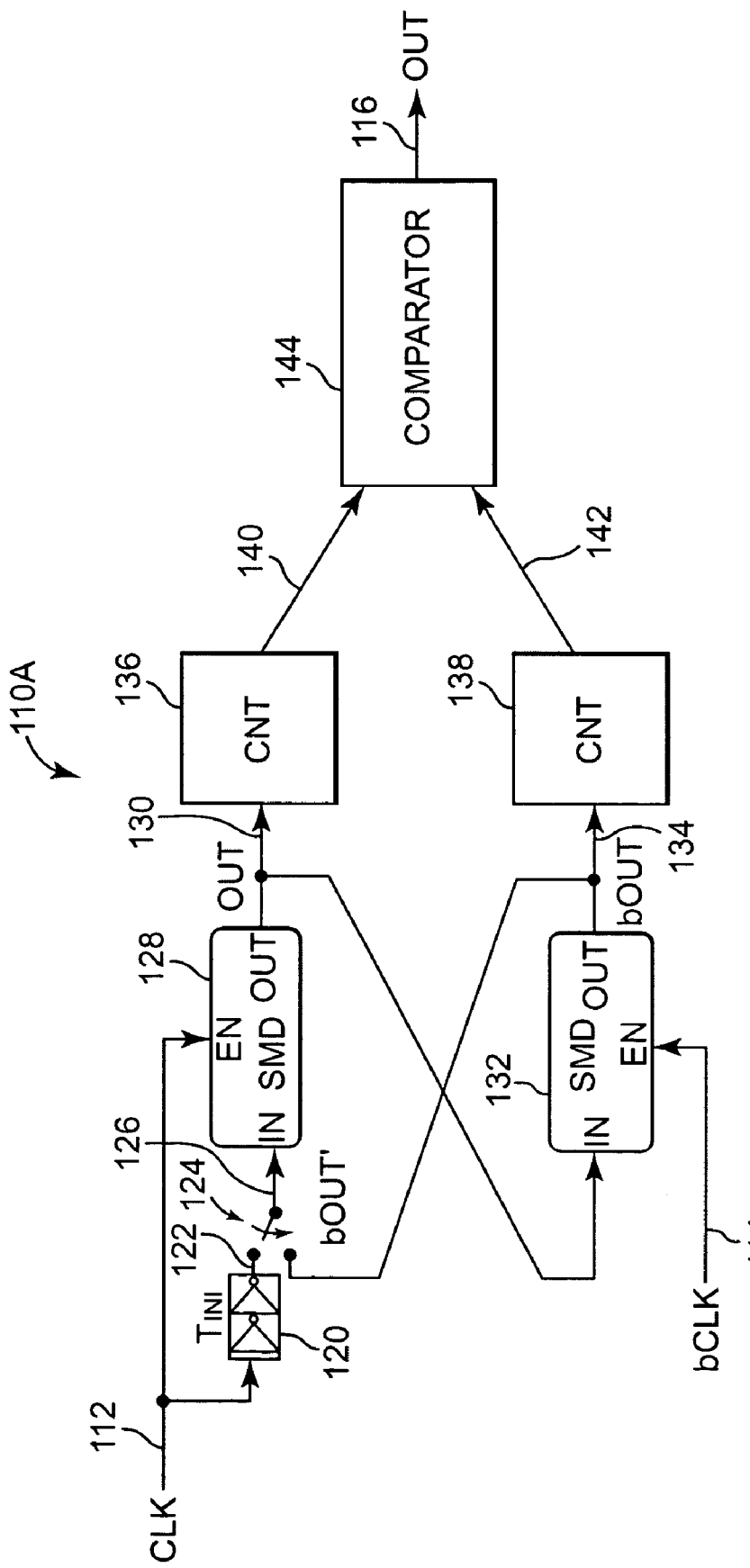
FIG. 2 is a block diagram illustrating a first embodiment of the duty distortion detector.

FIG. 2 is a block diagram illustrating one embodiment 110A of duty distortion detector 110. Duty distortion detector 110A includes SMDs 128 and 132, initialization ($T_{INI}$) delay 120, counters 136 and 138, and comparator 144. CLK signal path 112 is electrically coupled to the input of $T_{INI}$ delay 120 and the enable (EN) input of SMD 128. The output of $T_{INI}$ delay 120 is electrically coupled to a first contact of switch 124 through signal path 122. Switch 124 is electrically coupled to input IN of SMD 128 through bOUT' signal path 126. The output of SMD 128 is electrically coupled to the input of counter 136 and input IN of SMD 132 through OUT signal path 130. The output of counter 136 is electrically coupled to a first input of comparator 144 through signal path 140. The bCLK signal path 114 is electrically coupled to input EN of SMD 132. The output of SMD 132 is electrically coupled to a second contact of switch 124 and the input of counter 138 through bOUT signal path 134. The output of counter 138 is electrically coupled to a second input of comparator 144 through signal path 142. Comparator 144 is electrically coupled to OUT signal path 116.

In one embodiment $T_{INI}$ delay 120 comprises two inverters to delay the CLK signal on CLK signal path 112 to provide a delayed CLK signal on signal path 122. The delayed CLK signal on signal path 122 provides an initialization signal to the input of SMD 128 with switch 124 positioned to connect signal path 122 to bOUT' signal path 126. The delay of $T_{INI}$ delay 120 is less than one half the cycle of the CLK signal.

SMD 128 receives the CLK signal on CLK signal path 112 and the bOUT' signal on bOUT' signal path 126. SMD 128 mirrors the bOUT' signal with respect to the CLK signal to provide the OUT signal on OUT signal path 130. The rising edge of the bOUT' signal is mirrored with respect to the falling edge of the CLK signal, as described in more detail below with reference to FIG. 3.

SMD 132 receives the bCLK signal on bCLK signal path 114 and the OUT signal on OUT signal path 130. SMD 132 mirrors the OUT signal with respect to the bCLK signal to provide the bOUT signal on bOUT signal path 134. The rising edge of the OUT signal is mirrored with respect to the falling edge of the bCLK signal, as described in more detail below with reference to FIG. 3.

Counter 136 receives the OUT signal on OUT signal path 130 and increments by one in response to each rising edge of the OUT signal. Counter 138 receives the bOUT signal on bOUT signal path 134 and increments by one in response to each rising edge of the bOUT signal. Comparator 144 receives the count from counter 136 on signal path 140 and the count from counter 138 on signal path 142. Comparator 144 compares the count of counter 136 to the count of counter 138 to provide the OUT signal on OUT signal path 116. The OUT signal indicates whether the duty cycle of the CLK signal is greater than 50%, less than 50%, or approximately equal to 50%. If the count of counter 136 is greater than the count of counter 138, then comparator 144 outputs a signal indicating that the duty cycle of the CLK signal is less than 50%. If the count of counter 136 equals the count of counter 138, then comparator 144 outputs a signal indicating that the duty cycle of the CLK signal is greater than 50%. If the count of counter 136 or the count of counter 138 is a maximum specified value, comparator 144 outputs a signal indicating that the duty cycle of the CLK signal is approximately 50%.

In operation, switch 124 is switched to connect signal path 122 to bOUT' signal path 126 to initiate duty distortion detector 110A. Immediately after receiving a rising edge of the bOUT' signal at input IN of SMD 128, switch 124 is switched to connect bOUT signal path 134 to bOUT' signal path 126. SMD 128 mirrors the initialization signal with respect to the CLK signal to provide the OUT signal on OUT signal path 130. The OUT signal on OUT signal path 130 is mirrored by SMD 132 with respect to the bCLK signal to provide the bOUT signal on bOUT signal path 134. With switch 124 coupling bOUT' signal path 126 to bOUT signal path 134, the bOUT signal and the bOUT' signal are the same signal. SMD 128 then mirrors the bOUT signal with respect to the CLK signal to provide the OUT signal. In response to each rising edge of the OUT signal, counter 136 increments by one. In response to each rising edge of the bOUT signal, counter 138 increments by one. SMD 128 and SMD 132 continue to mirror the bOUT signal and the OUT signal, respectively, until either the bOUT signal or the OUT signal can no longer be mirrored or until the count of counter 136 or the count of counter 138 reaches a maximum specified value.

Once either the bOUT signal or the OUT signal can no longer be mirrored or the count of counter 136 or the count of counter 138 reaches a maximum specified value, comparator 144 compares the count of counter 136 and the count of counter 138 to complete the duty distortion detection process. Comparator 144 outputs the OUT signal indicating the CLK signal has a duty cycle of approximately 50% if either the count of counter 136 or the count of counter 138 is a maximum specified value. Comparator 144 outputs the OUT signal indicating the CLK signal has a duty cycle less than 50% if the count of counter 136 is greater than the count of counter 138. Comparator 144 outputs the OUT signal indicating the CLK signal has a duty cycle greater than 50% if the count of counter 136 equals the count of counter 138. The OUT signal can then be used by other circuits in memory circuit 102, such as by a duty cycle correction circuit. Duty distortion detector 10A is reset to perform another duty distortion detection by resetting counter 136 to zero and counter 138 to zero. By using SMD 128 and SMD 132, the duty distortion detected by duty distortion detector 110A is not effected by mirroring errors of SMD 128 and SMD 132, as long as any mirroring errors are not random.

Figure 3:
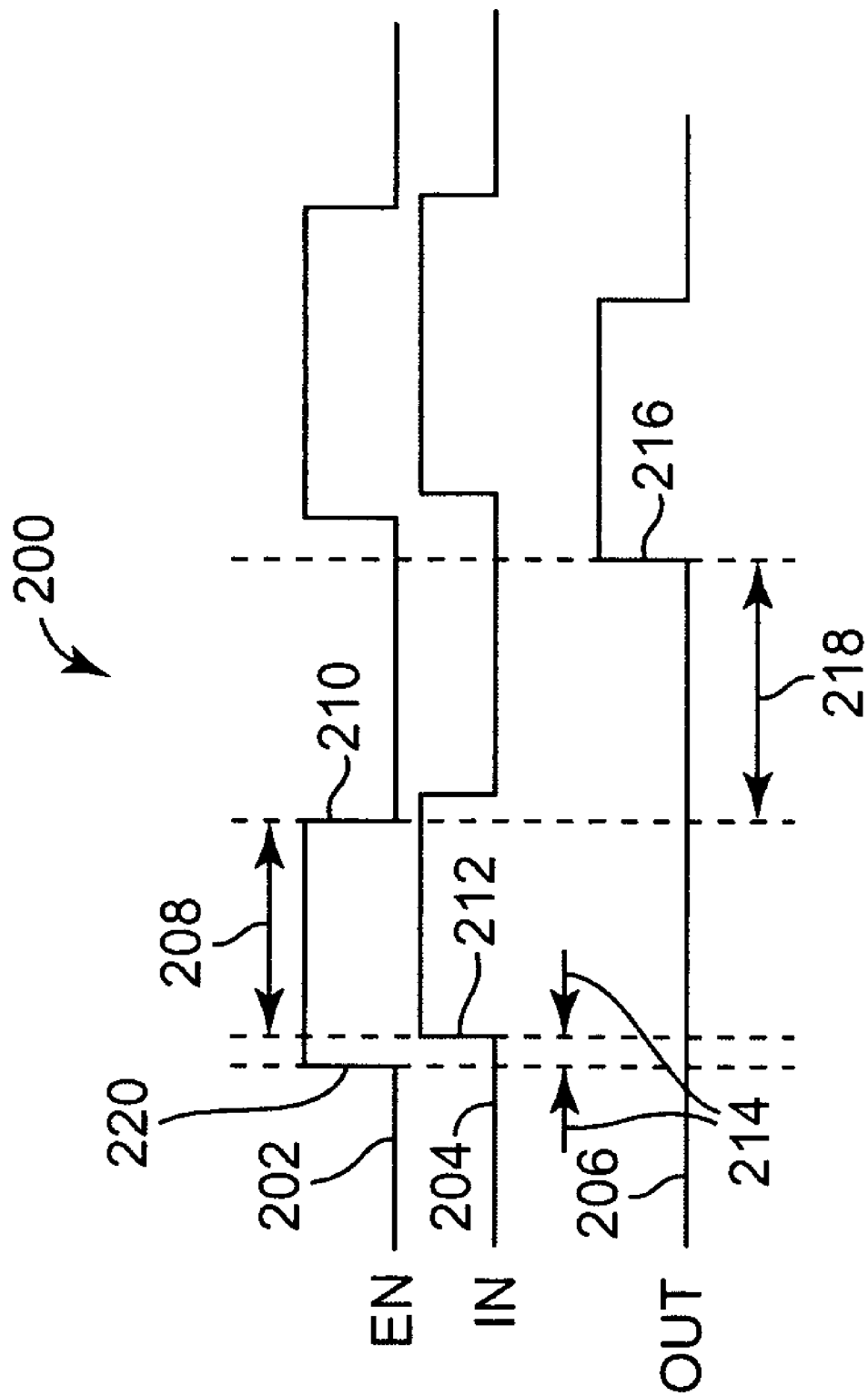
FIG. 3 is a timing diagram illustrating one embodiment of the timing of signals for a synchronous mirror delay (SMD).

FIG. 3 is a timing diagram 200 illustrating one embodiment of the timing of signals for SMD 128 and SMD 132. Timing diagram 200 includes input EN signal 202 on CLK signal path 112 or bCLK signal path 114, input IN signal 204 on bOUT' signal path 126 or OUT signal path 130, and OUT signal 206 on OUT signal path 130 or bOUT signal path 134. With rising edge 212 of input IN signal 204 delayed with respect to rising edge 220 of input EN signal 202 by the delay indicated at 214, rising edge 212 is mirrored with respect to falling edge 210 of input EN signal 202. The delay between rising edge 212 of input IN signal 204 and falling edge 210 of input EN signal 202 is indicated at 208. Rising edge 216 of OUT signal 206 is delayed with respect to falling edge 210 of input EN signal 202 by the delay indicated at 218. The delay indicated at 218 is equal to the delay indicated at 208.

Figure 4:
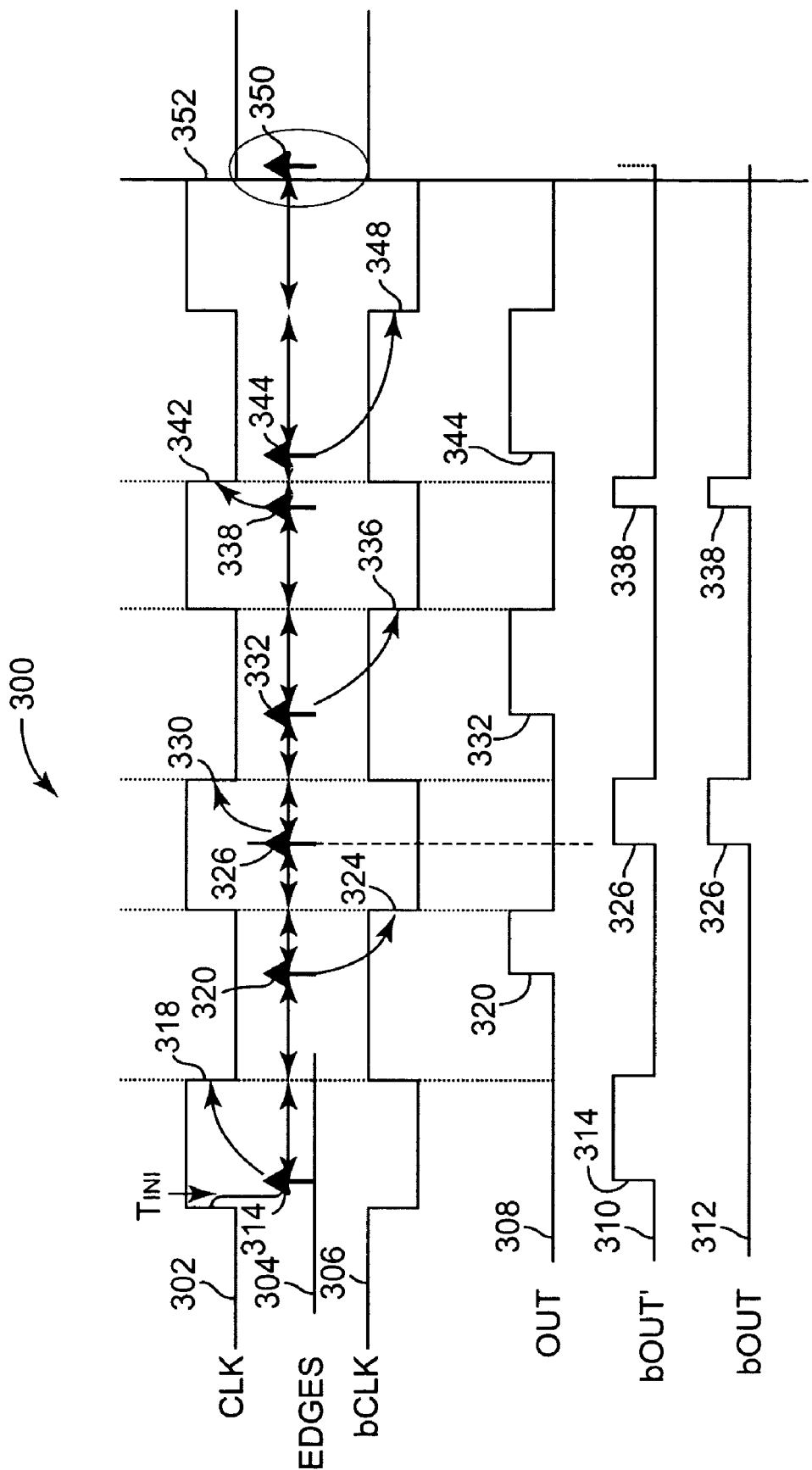
FIG. 4 is a timing diagram illustrating one embodiment of the timing of signals for the first embodiment of the duty distortion detector.

FIG. 4 is a timing diagram 300 illustrating the timing of signals for duty distortion detector 110A. Timing diagram 300 includes CLK signal 302 on CLK signal path 112, rising edges 304 of the OUT signal and the bOUT signal, bCLK signal 306 on bCLK signal path 114, OUT signal 308 on OUT signal path 130, bOUT' signal 310 on bOUT' signal path 126, and bOUT signal 312 on bOUT signal path 134.

To initiate duty distortion detector 110A to begin detecting the duty distortion, switch 124 is switched to couple signal path 122 to bOUT' signal path 126. $T_{INI}$ delay 120 delays the rising edge of CLK signal 302 to provide a rising edge 314 of bOUT' signal 310. Switch 124 then is then switched to couple bOUT signal path 134 to bOUT' signal path 126. Rising edge 314 is mirrored by SMD 128 with respect to falling edge 318 of CLK signal 302 to provide rising edge 320 of OUT signal 308. Rising edge 320 of OUT signal 308 is mirrored by SMD 132 with respect to falling edge 324 of bCLK signal 306 to provide rising edge 326 of bOUT signal 312, which is now the same signal as bOUT' signal 310.

Rising edge 326 of bOUT signal 312 is mirrored by SMD 128 with respect to falling edge 330 of CLK signal 302 to provide rising edge 332 of OUT signal 308. Rising edge 332 of OUT signal 308 is mirrored by SMD 132 with respect to falling edge 336 of bCLK signal 306 to provide rising edge 338 of bOUT signal 312. Rising edge 338 of bOUT signal 312 is mirrored by SMD 128 with respect to falling edge 342 of CLK signal 302 to provide rising edge 344 of OUT signal 308. SMD 132 attempts to mirror rising edge 344 of OUT signal 308 with respect to falling edge 348 of bCLK signal 306, but the mirroring fails. If rising edge 344 was mirrored with respect to falling edge 348 of bCLK signal 306, the expected rising edge 350 falls beyond falling edge 352 of CLK signal 302. Therefore, rising edge 350 is not provided by SMD 132.

The three rising edges 320, 332, and 344 of OUT signal 308 are counted by counter 136. The two rising edges 326 and 338 of bOUT signal 312 are counted by counter 138. Comparator 144 compares the count of counter 136 and the count of counter 138 and outputs a signal indicating the duty cycle is less than 50% in this case. In the case of an opposite situation where the duty cycle is greater than 50%, the mirroring process of SMD 128 would fail before the mirroring process of SMD 132. If the mirroring process of SMD 128 and SMD 132 do not fail before counter 136 or counter 138 reaches a maximum specified value, such as 1000, the duty cycle of the CLK signal is approximately 50%.

Figure 5:
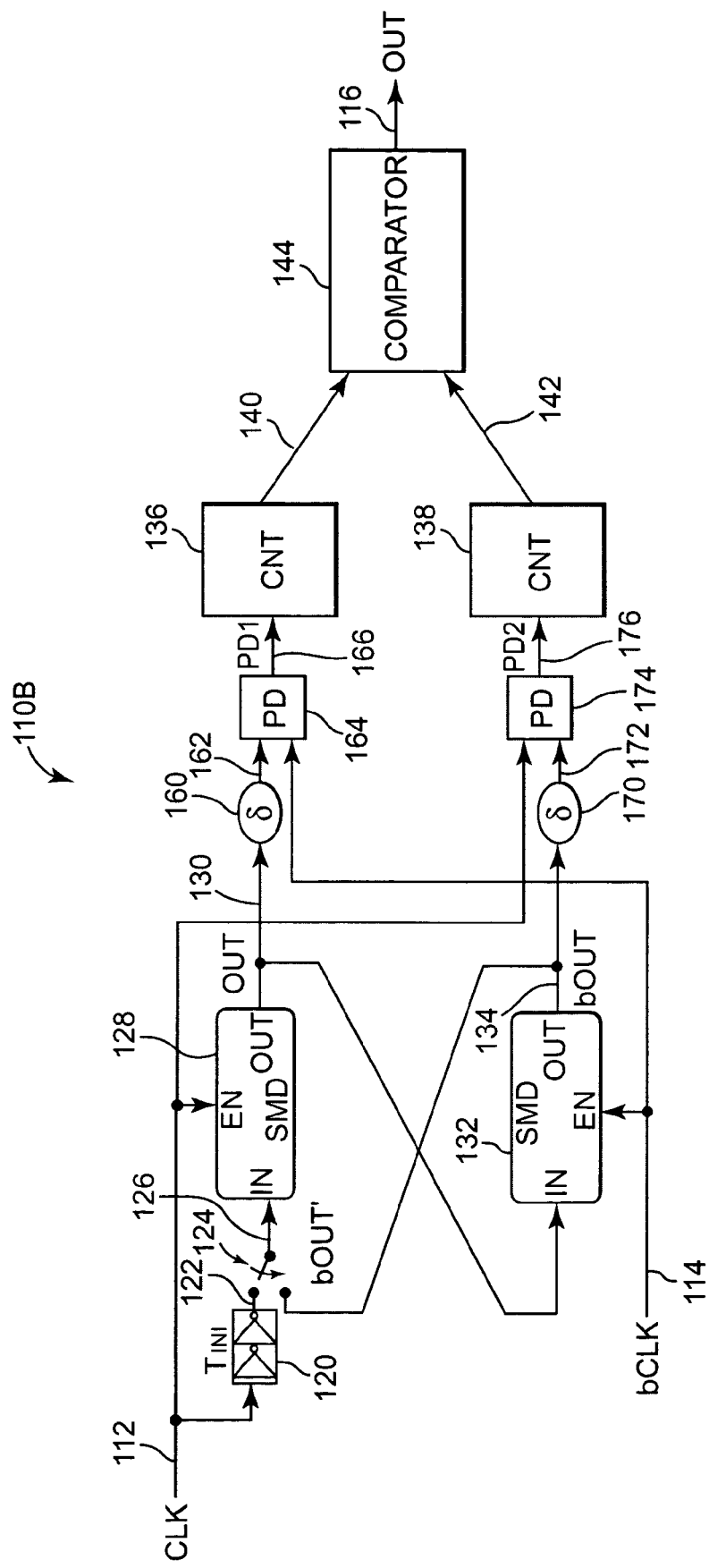
FIG. 5 is a block diagram illustrating a second embodiment of the duty distortion detector.

FIG. 5 is a block diagram illustrating a second embodiment 110B of duty distortion detector 110. Duty distortion detector 110B is similar to duty distortion detector 110A except for the addition of delay lines 160 and 170 and phase detectors 164 and 174. The output of SMD 128 is electrically coupled to the input of delay line 160 through OUT signal path 130. The output of delay line 160 is electrically coupled to a first input of phase detector 164 through signal path 162. The bCLK signal path 114 is electrically coupled to a second input of phase detector 164. The output of phase detector 164 is electrically coupled to the input of counter 136 through PD1 signal path 166. The output of SMD 132 is electrically coupled to the input of delay line 170 through bOUT signal path 134. The output of delay line 170 is electrically coupled to a first input of phase detector 174 through signal path 172. CLK signal path 112 is electrically coupled to a second input of phase detector 174. The output of phase detector 174 is electrically coupled to the input of counter 138 through PD2 signal path 176.

Delay line 160 delays the OUT signal on OUT signal path 130. Delay line 170 delays the bOUT signal on bOUT signal path 170. Delay line 160 and delay line 170 prevent SMD 128 and SMD 132 from reaching the point where the mirroring process fails by reducing the number of cycles of the CLK signal used to detect the duty distortion.

Phase detector 164 receives the delayed OUT signal on signal path 162 and the bCLK signal on bCLK signal path 114 and compares the delayed OUT signal to the BCLK signal. Phase detector 164 provides the PD1 signal on PD1 signal path 166 based on the comparison. If a rising edge of the delayed OUT signal is received before a falling edge of the bCLK signal, phase detector 164 outputs a pulse on PD1 signal path 166 to be counted by counter 136. If a falling edge the bCLK signal is received before a rising edge of the delayed OUT signal, phase detector 164 does not output a pulse on PD1 signal path 166. With no signal output by phase detector 164, comparator 144 compares the count of counter 136 and the count of counter 138 to complete the duty distortion detection process.

Phase detector 174 receives the delayed bOUT signal on signal path 172 and the CLK signal on CLK signal path 112. Phase detector 172 provides the PD2 signal on PD2 signal path 176 based on the comparison. If a rising edge of the delayed bOUT signal is received before a falling edge of the CLK signal, phase detector 174 outputs a pulse on PD2 signal path 176 to be counted by counter 138. If a falling edge the CLK signal is received before a rising edge of the delayed bOUT signal, phase detector 174 does not output a pulse on PD2 signal path 176. With no signal output by phase detector 174, comparator 144 compares the count of counter 136 and the count of counter 138 to complete the duty distortion detection process.

Duty distortion detector 110B operates similar to duty distortion detector 110A except that the duty distortion detection process is shorter for duty distortion detector 110B. Delay lines 160 and 170 and phase detectors 164 and 174 reduce the number of cycles of the CLK signal used for detecting duty distortion. The duty distortion detection process is completed before the mirroring process of SMD 128 and SMD 132 fails, as illustrated in more detail below with reference to FIG. 7.

Figure 6:
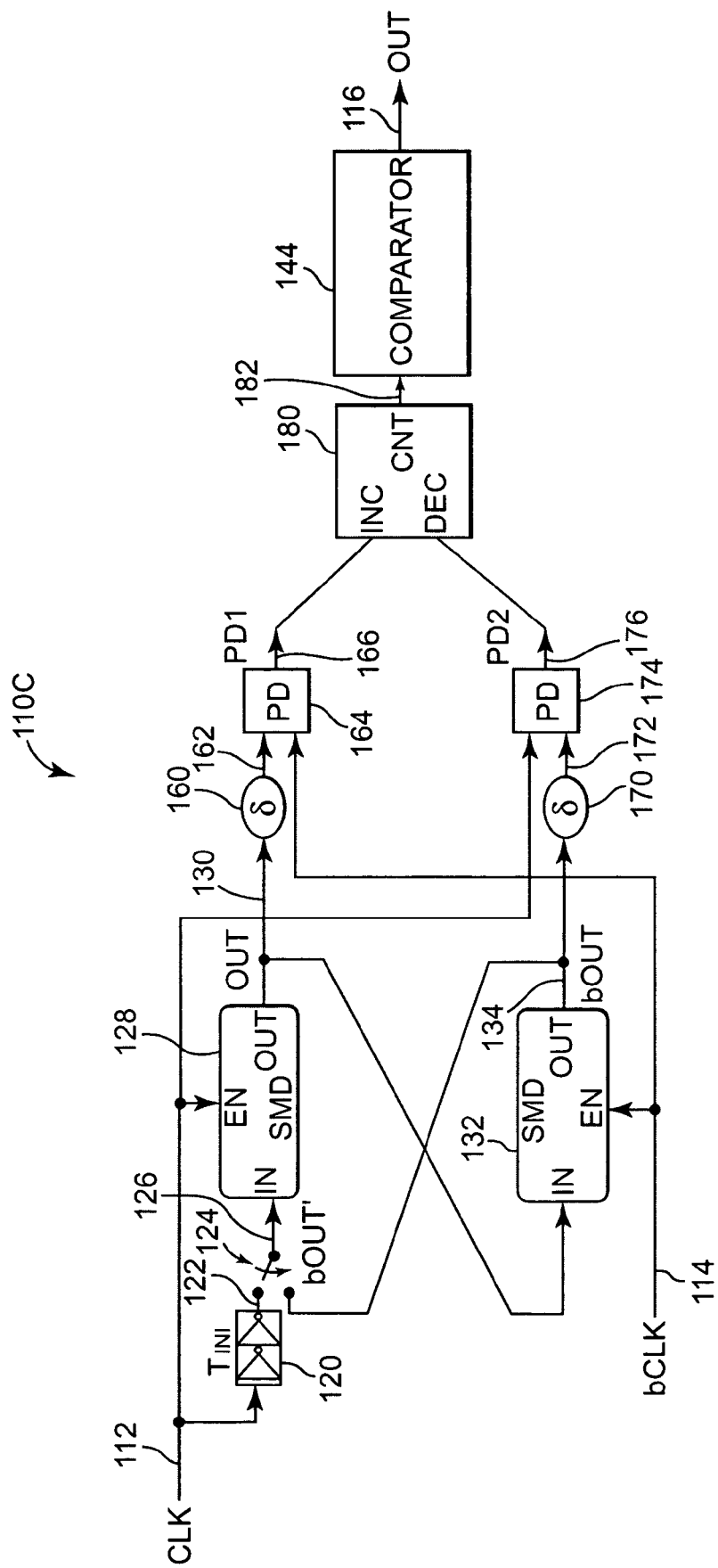
FIG. 6 is a block diagram illustrating a third embodiment of the duty distortion detector.

FIG. 6 is a block diagram illustrating a third embodiment 110C of duty distortion detector 110. Duty distortion detector 110C is similar to duty distortion detector 110B except counter 136 and counter 138 are replaced by up/down counter 180. The output of phase detector 164 is electrically coupled to the increment input of up/down counter 180 through PD1 signal path 166. The output of phase detector 174 is electrically coupled to the decrement input of up/down counter 180 through PD2 signal path 176. The output of up/down counter 180 is electrically coupled to the input of comparator 144 through signal path 182.

Counter 180 increments by one count for each rising edge of the PD1 signal received and decrements by one count for each rising edge of the PD2 signal received. Therefore, once either phase detector 164 or phase detector 174 fails to provide a pulse in response to the delayed OUT signal or the delayed bOUT signal, respectively, the count of up/down counter 180 is used to determine the duty cycle of the CLK signal. If up/down counter 180 has a count of zero, the duty cycle of the CLK signal is greater than 50%. If up/down counter 180 has a count of one, the duty cycle of the CLK signal is less than 50%. Duty distortion detector 110C is reset to perform another duty distortion detection by resetting counter 180 to zero.

Figure 7:
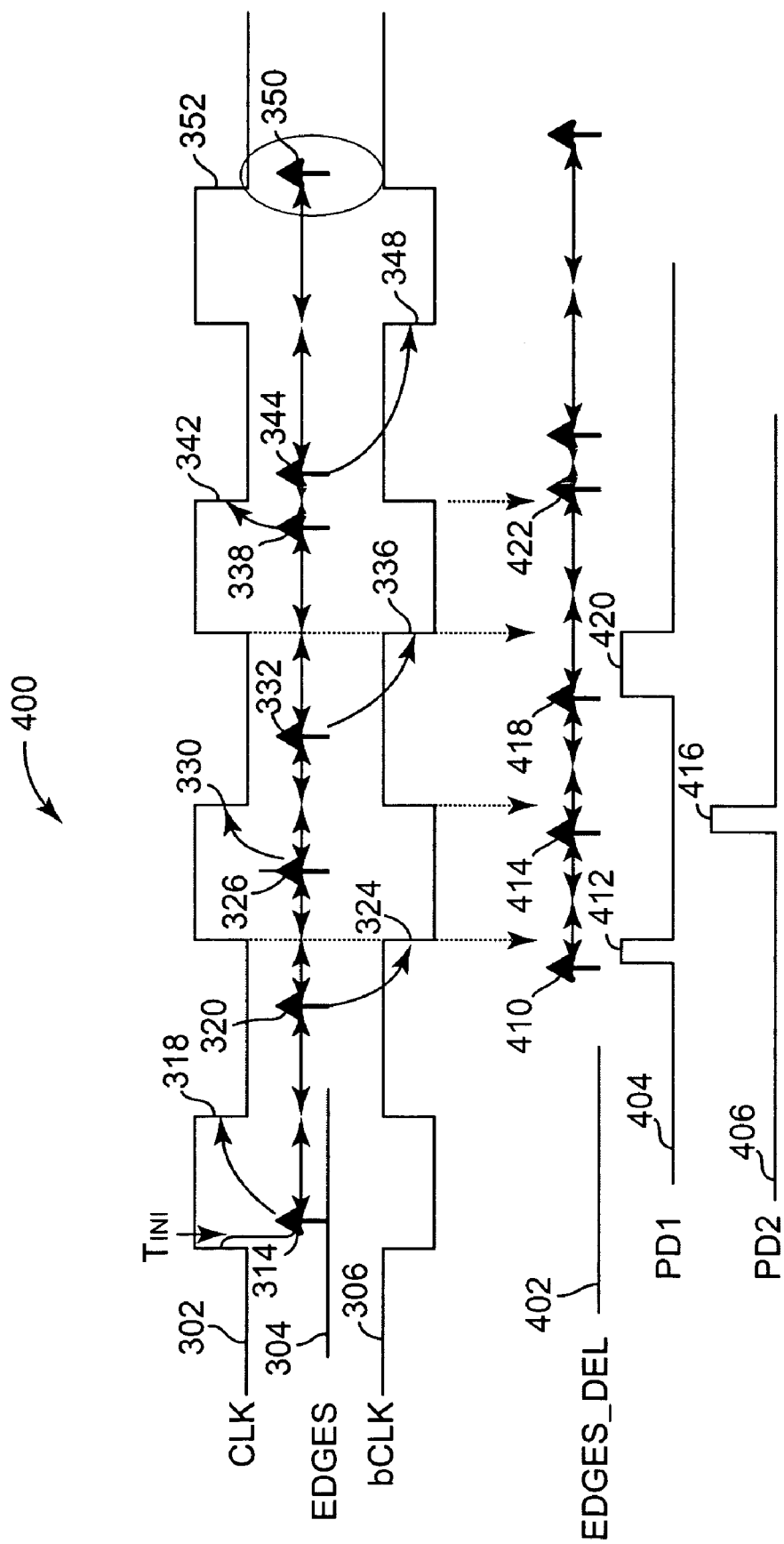
FIG. 7 is a timing diagram illustrating one embodiment of the timing of signals for the second and third embodiments of the duty distortion detector.

FIG. 7 is a timing diagram 400 illustrating one embodiment of the timing of signals for duty distortion detector 110B and duty distortion detector 110C. Timing diagram 400 includes CLK signal 302 on clock signal path 112, rising edges 304 of the OUT signal and the bOUT signal, bCLK signal 306 on bCLK signal path 114, delayed rising edges 402 on signal path 162 and signal path 172, PD1 signal 404 on PD1 signal path 166, and PD2 signal 406 on PD2 signal path 176. CLK signal 302, rising edges 304 of the OUT signal and the bOUT signal, and bCLK signal 306, including reference numbers 314–352 are similar to the signals and reference numbers described in timing diagram 300 of FIG. 4.

In this embodiment, delay line 160 delays rising edge 320 of the OUT signal to provide rising edge 410 on signal path 162. Rising edge 410 is received by phase detector 164, which in response provides pulse 412 of PD1 signal 404. Delay line 170 delays rising edge 326 of the bOUT signal to provide rising edge 414 on signal path 172. Rising edge 414 is received by phase detector 174, which in response provides pulse 416 of PD2 signal 406. Delay line 160 delays rising edge 332 of the OUT signal to provide rising edge 418 on signal path 162. Rising edge 418 is received by phase detector 164, which in response provides pulse 420 of PD1 signal 404. Delay line 170 delays rising edge 338 of the bOUT signal to provide rising edge 422 on signal path 172. Falling edge 342 of CLK signal 302 is received by phase detector 174 before rising edge 422 on signal path 172. Therefore, phase detector 174 does not output a pulse on PD2 signal 406.

For duty distortion detector 110B, counter 136 counts pulses 412 and 420 and counter 138 counts pulse 416. Therefore, the duty cycle of CLK signal 302 is less than 50% in this case. For duty distortion detector 110C, up/down counter 180 has a count of one. Therefore, duty distortion detector 110C also indicates that the duty cycle of CLK signal 302 is less than 50% in this case. This result is the same as the result obtained for duty distortion detector 110A, but the result is obtained in fewer cycles of CLK signal 302. In addition, the result is obtained before the mirroring process of SMD 128 or SMD 132 fails.

The embodiments of duty distortion detector 110 provide a fast and efficient process to detect the duty distortion of a differential clock signal by using two SMDs. The output signal of the first SMD is mirrored by the second SMD with respect to the inverted clock signal, and the output signal of the second SMD is mirrored by the first SMD with respect to the clock signal. The rising edges of the output signals of the SMD are counted and compared to determine if the duty cycle of the differential clock signal is less than 50%, greater than 50%, or approximately equal to 50%.

What is claimed is:

1. A duty distortion detector comprising:
   a first synchronous mirror delay configured to mirror a first signal with respect to a clock signal to provide a second signal; and
   a second synchronous mirror delay configured to mirror the second signal with respect to an inverted clock signal to provide the first signal.

2. The duty distortion detector of claim 1, further comprising:
   a first counter configured to count pulses of the second signal; and
   a second counter configured to count pulses of the first signal.

3. The duty distortion detector of claim 2, further comprising:
   a comparator configured to compare the count of pulses of the second signal to the count of pulses of the first signal to determine a duty distortion.

4. The duty distortion detector of claim 1, further comprising:
   a first delay configured to delay the second signal to provide a delayed second signal; and
   a second delay configured to delay the first signal to provide a delayed first signal.

5. The duty distortion detector of claim 4, further comprising:
   a first phase detector configured to compare the delayed second signal to the inverted clock signal to provide a third signal; and
   a second phase detector configured to compare the delayed first signal to the clock signal to provide a fourth signal.

6. The duty distortion detector of claim 5, further comprising:
   a first counter configured to count pulses of the third signal; and
   a second counter configured to count pulses of the fourth signal.

7. The duty distortion detector of claim 6, further comprising:
   a comparator configured to compare the count of pulses of the third signal and the count of pulses of the fourth signal to determine a duty distortion.

8. The duty distortion detector of claim 5, further comprising:
   a counter configured to receive the third signal and the fourth signal and to increment in response to pulses of the third signal and decrement in response to pulses of the fourth signal.

9. The duty distortion detector of claim 1, further comprising:
   a switch configured to receive and initialization signal and the first signal and to switch between providing the initialization signal and the first signal to the first synchronous mirror delay.

10. The duty distortion detector of claim 9, further comprising:
    a delay circuit configured to delay the clock signal to provide the initialization signal.

11. A duty distortion detector comprising:
    a first synchronous mirror delay configured to receive a first signal and a clock signal and mirror the first signal with respect to the clock signal to provide a second signal;
    a second synchronous mirror delay configured to receive the second signal and an inverted clock signal and mirror the second signal with respect to the inverted clock signal to provide the first signal;
    a first counter configured to count pulses of the first signal;
    a second counter configured to count pulses of the second signal; and
    a comparator configured to compare the count of pulses of the first signal and the count of pulses of the second signal to determine a duty distortion.

12. The duty distortion detector of claim 11, further comprising:
    an initialization circuit configured to provide an initialization signal to the first synchronous mirror delay.

13. The duty distortion detector of claim 11, wherein if the count of pulses of the first signal is equal to the count of pulses of the second signal, then a duty cycle of the clock signal is greater than 50%.

14. The duty distortion detector of claim 11, wherein if the count of pulses of the first signal is a maximum value, then a duty cycle of the clock signal is equal to approximately 50%.

15. The duty distortion detector of claim 11, wherein if the count of pulses of the first signal is less than the count of pulses of the second signal, then a duty cycle of the clock signal is less than 50%.

16. A duty distortion detector comprising:
    a first synchronous mirror delay configured to receive a first signal and a clock signal and mirror the first signal with respect to the clock signal to provide a second signal;
    a second synchronous mirror delay configured to receive the second signal and an inverted clock signal and mirror the second signal with respect to the inverted clock signal to provide the first signal;
    a first delay configured to delay the first signal and provide a third signal;
    a second delay configured to delay the second signal and provide a fourth signal;
    a first phase detector configured to compare the third signal to the clock signal to provide a fifth signal;
    a second phase detector configured to compare the fourth signal to the inverted clock signal to provide a sixth signal;
    a first counter configured to count pulses of the fifth signal;
    a second counter configured to count pulses of the sixth signal; and
    a comparator configured to compare the count of pulses of the fifth signal and the count of pulses of the sixth signal to determine a duty distortion.

17. The duty distortion detector of claim 16, further comprising:
    an initialization circuit configured to provide an initialization signal to the first synchronous mirror delay.

18. A method of detecting duty distortion, the method comprising:
    mirroring a first signal with respect to a clock signal to provide a second signal;
    mirroring the second signal with respect to an inverted clock signal to provide the first signal; and
    determining a duty distortion based on the second signal and the first signal.

19. The method of claim 18, wherein mirroring the first signal and mirroring the second signal comprises mirroring the first signal and mirroring the second signal until one of mirroring the first signal and mirroring the second signal fails.

20. The method of claim 18, further comprising:
provessing an initialization signal to start the mirroring of the first signal.

21. The method of claim 18, wherein determining the duty distortion comprises:
counting pulses of the second signal;
counting pulses of the first signal; and
comparing the count of pulses of the second signal to the count of pulses of the first signal.

22. The method of claim 18, wherein determining the duty distortion comprises:
delaying the second signal to provide a third signal;
delaying the first signal to provide a fourth signal;
comparing the third signal to the inverted clock signal to provide a fifth signal;
comparing the fourth signal to the clock signal to provide a sixth signal;
counting pulses of the fifth signal;
counting pulses of the sixth signal; and
comparing the count of pulses of the fifth signal to the count of pulses of the sixth signal.

23. A memory system comprising:
a memory circuit comprising a duty distortion detector, the duty distortion detector comprising:
a first synchronous mirror delay configured to mirror a first signal with respect to a clock signal to provide a second signal; and
a second synchronous mirror delay configured to mirror the second signal with respect to an inverted clock signal to provide the first signal.

24. The memory system of claim 23, further comprising:
a host coupled to the memory circuit, the host configured to pass the clock signal and the inverted clock signal to the memory circuit.

25. A duty distortion detector comprising:
means for mirroring a first signal with respect to a clock signal to provide a second signal;
means for mirroring the second signal with respect to an inverted clock signal to provide the first signal; and
means for determining a duty distortion based on the second signal and the first signal.

* * * * *